United States Patent
Miura et al.

(10) Patent No.: US 6,514,364 B2
(45) Date of Patent: *Feb. 4, 2003

(54) MANUFACTURING METHOD OF WIRING BOARD, AND CONDUCTIVE PASTE USED THEREIN

(75) Inventors: Kazuhiro Miura, Osaka (JP); Yoshihisa Takase, Higashiosaka (JP); Masaaki Hayama, Nara (JP); Eiji Kawamoto, Takatsuki (JP); Yuji Yagi, Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/459,778

(22) Filed: Dec. 13, 1999

(65) Prior Publication Data

US 2002/0056509 A1 May 16, 2002

(30) Foreign Application Priority Data

Dec. 11, 1998 (JP) ............................................. 10-352736

(51) Int. Cl.⁷ .............................. B32B 31/12; B32B 3/20
(52) U.S. Cl. .................... 156/89.12; 156/230; 156/241; 156/247; 156/277
(58) Field of Search ........................ 156/89.11, 89.12, 156/230, 234, 241, 247, 277

(56) References Cited

U.S. PATENT DOCUMENTS 4,104,345 A * 8/1978 Anderson et al. .......... 156/89.11
5,209,873 A * 5/1993 Yamamoto et al. .......... 252/512
5,609,704 A * 3/1997 Hayama et al. ................ 156/89
5,897,723 A * 4/1999 Tatumoto et al. ............ 156/245
6,132,543 A * 10/2000 Mohri et al. ............. 156/89.12

FOREIGN PATENT DOCUMENTS

| JP | H3-20914 | 2/1986 |
| JP | 6-20035 | 3/1994 |
| JP | 9-246125 | 9/1997 |

* cited by examiner

Primary Examiner—Michael W. Ball
Assistant Examiner—John T. Haran
(74) Attorney, Agent, or Firm—RatnerPrestia

(57) ABSTRACT

The conductive particles can be sintered without being influenced by softening and removing of the adhesive layer. As a result, a wiring pattern of high precision can be formed without causing deformation of conductive pattern. It includes a step of filling grooves having a wiring pattern on a film with a conductive paste containing conductive component and resins, a step of adhering the conductive paste side surface of the film having the conductive paste to the adhesive layer side surface of the ceramic substrate having the adhesive layer, a step of forming a conductive pattern on the adhesive layer surface by peeling off the film substrate from a first laminated body having the film, conductive paste, adhesive layer, ceramic substrate, and film, and transferring the conductive paste filling up the grooves onto the surface of the adhesive layer, and a step of firing a second laminated body having the ceramic substrate, adhesive layer and conductive pattern, removing the adhesive layer, and sintering the conductive particles, in which the conductive component in the conductive paste is sintered at least (i) after the adhesive layer is softened, or (ii) after the adhesive layer is burnt.

15 Claims, 1 Drawing Sheet

MANUFACTURING METHOD OF WIRING BOARD, AND CONDUCTIVE PASTE USED THEREIN

FIELD OF THE INVENTION

The present invention relates to a manufacturing method of wiring board having a semiconductor LSI and a ceramic substrate, and a conductive paste used therein.

PRIOR ART

Recently, semiconductor LSI and solid composite parts are more and more reduced in size and weight, and the wiring boards for mounting them are also required to be smaller and lighter. To meet such demands, the ceramic substrate is capable of wiring at density as high as demanded, and hence the ceramic substrate is highly noticed today in the electronics industry.

As the wiring pattern forming method, Japanese Patent Publication No. 6-20035 discloses a method of applying a conductive ink by using an intaglio printing method. Japanese Laid-open Patent No. 9-246125 discloses a method of adhering an electrode material layer to a substrate by using a heat transfer film.

The patterns transferred by these prior arts have a thin film thickness. Accordingly, when such transferred patterns are used as fine patterns, the wiring resistance is heightened.

Japanese Patent Publication No. 3-20914 discloses a method of fabricating fine lines for realizing high density wiring. That is, it proposes a method comprising a step of filling the intaglio grooves of a flexible resin film with a conductive paste and drying, a step of transferring the conductive paste onto a substrate having an adhesive layer, and a step of baking the substrate and forming the conductive pattern. This method is capable of forming a fine conductive pattern, and moreover since the wiring resistance is lowered, the conductive pattern having a thick film thickness is formed. Hence, this method is an effective wiring forming method for fabricating high density wiring.

In this method, however, since the conductive paste is transferred on the adhesive layer on the substrate, and the adhesive layer and conductive paste are baked at the same time, the adhesive layer is softened and removed, and due to the effects at this time, the conductive pattern formed of the conductive paste placed on the adhesive layer may be deformed.

That is, before completion of combustion of the adhesive layer, if the resin component contained in the conductive paste is burnt completely or partly, conductive particles of the conductive paste may be burnt completely or partly without adhering to the substrate. Accordingly, sufficient adhesion strength of the conductive paste is not obtained, and the conductive pattern formed of the conductive paste is deformed. As a result, it was difficult to form a fine pattern of high precision.

The invention is devised to solve these problems, and to realize a fine pattern forming of high precision by using film intaglio transfer method, it is an object of the invention to present a manufacturing method of wiring board in consideration of materials such as adhesive layer and conductive paste so that the conductive particles of the conductive paste may be baked on the substrate without having effects of combustion of the adhesive layer, and also in consideration of peeling off the conductive pattern from the intaglio grooves, and a conductive paste used therein.

SUMMARY OF THE INVENTION

A manufacturing method of wiring board of the invention comprises:
(a) a step of forming an adhesive layer on the surface of a ceramic substrate,
(b) a step of forming grooves having a wiring pattern shape on a film,
(c) a step of filling the grooves with a conductive paste containing a conductive component and a resin,
(d) a step of adhering the conductive paste side surface of the film having the conductive paste to the adhesive layer side surface of the ceramic substrate having the adhesive layer,
(e) a step of forming a conductive pattern on the adhesive layer surface by peeling off the film from a first laminated body having the film, conductive paste, adhesive layer, ceramic substrate, and film, and transferring the conductive paste filling up the grooves onto the surface of the adhesive layer, and
(f) a step of firing a second laminated body having the ceramic substrate, adhesive layer and conductive pattern, removing the adhesive layer, and sintering the conductive particles,
in which the conductive component in the conductive paste is sintered at least one of (i) after the adhesive layer is softened, and (ii) after the adhesive layer is burnt.

Preferably, at the step (f), the resin contained in the conductive paste is burnt and removed after the adhesive layer is burnt and removed.

A conductive paste of the invention used in forming of a conductive pattern on a wiring board having an adhesive layer, a resin component as binder, and a solvent, in which the resin contains plural resins which are burnt and removed in a temperature having range from a temperature range of 150 to a temperature range of 360° C. at the time of firing.

Preferably, the resin contains plural resins which are burnt and removed in a temperature range for burning the adhesive layer.

In this constitution, at the time of firing, since the conductive particles of the conductive paste are sintered after softening or burning of the adhesive layer, the conductive particles can be sintered regardless of softening or removal of the adhesive layer, so that a conductive pattern wiring of excellent shape having high density and high precision can be obtained.

DESCRIPTION OF REFERENCE NUMERALS

Figure 1:
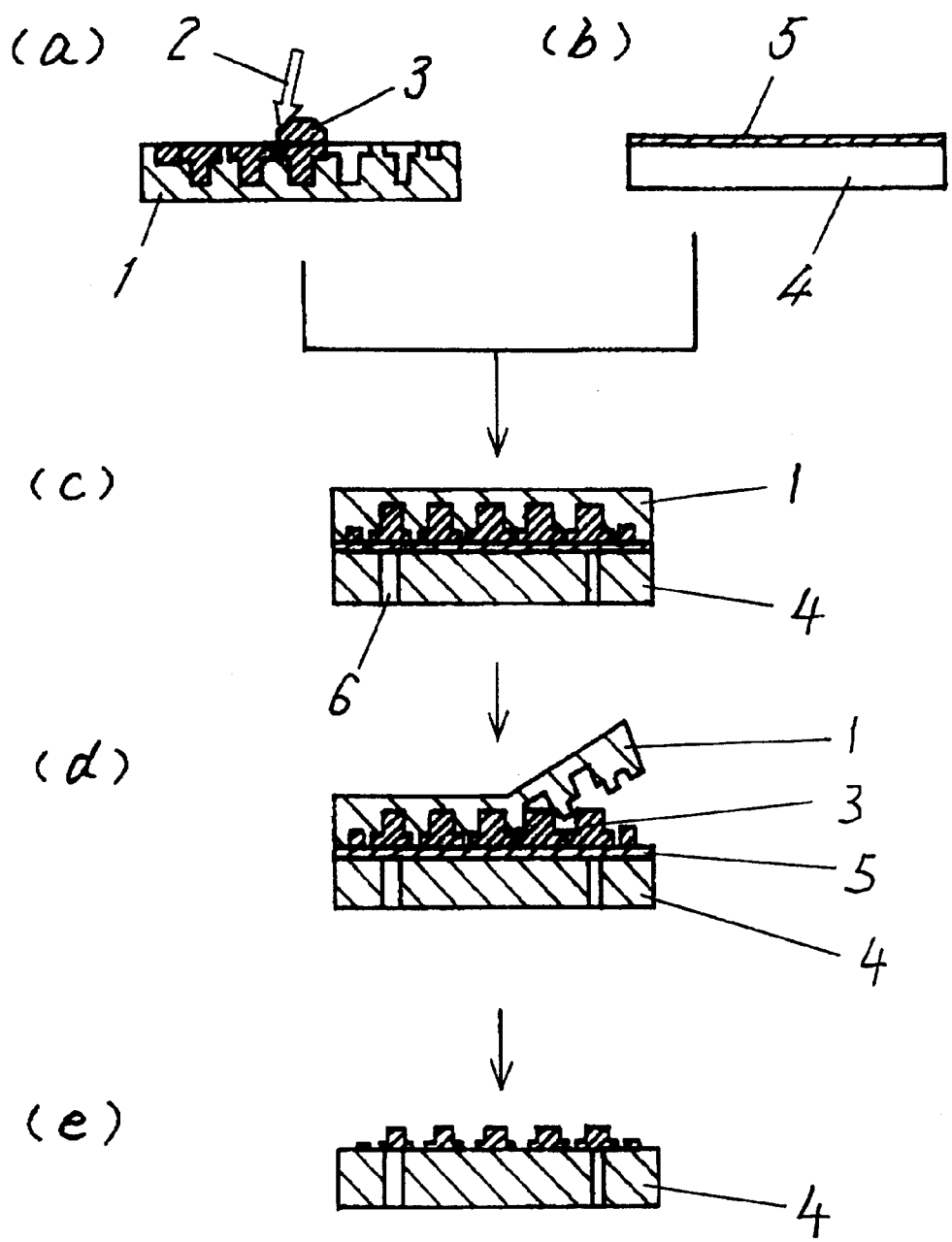
FIG. 1 is a process chart showing a manufacturing method of a wiring board in an embodiment of the invention.

1 Intaglio of polyimide film
2 Ceramic squeegee
3 Conductive paste
4 Ceramic substrate
5 Adhesive layer
6 Through-hole

DETAILED DESCRIPTION OF THE INVENTION

A manufacturing method of wiring board in an embodiment of the invention comprises:
a step of filling grooves formed in a film substrate (as film) with a conductive paste, a step of adhering the surface of the film substrate filled with the conductive paste to a ceramic substrate forming an adhesive layer, a step of forming a conductive pattern on the ceramic substrate by peeling off the film substrate from the ceramic substrate, and a step of firing the ceramic substrate forming the conductive pattern.

At the step of firing, the conductive particles of the conductive paste are sintered after softening or burning of the adhesive layer. In this method, the conductive particles of the conductive paste can be sintered after softening or burning of the adhesive layer at the time of firing, the conductive particles are sintered regardless of softening or removal of the adhesive layer. As a result, deformation of conductive pattern is prevented, so that a wiring of high precision can be obtained.

A manufacturing method of wiring board in other embodiment of the invention further comprises a step of forming plural layers of protrusions in the conductive pattern by forming grooves in plural layers. In this constitution, wirings and bumps can be formed simultaneously in the substrate by one transfer.

A manufacturing method of wiring board in a different embodiment of the invention further comprises a step of filling the grooves formed in the film substrate with conductive paste and drying, and repeating this filling and drying step plural times. In this constitution, if the intaglio grooves have a deep shape, the grooves can be densely filled with conductive paste, so that a fine pattern having a thick film thickness can be formed.

A manufacturing method of wiring board in other different embodiment of the invention further comprises a step of heating and compressing when adhering the surface of the film substrate filled with the conductive paste to the ceramic substrate forming the adhesive layer. In this constitution, a favorable transfer is possible even if the grooves have a deep shape.

A manufacturing method of wiring board in a further different embodiment of the invention further comprises a step of using an adhesive mainly composed of a thermoplastic resin as the adhesive layer. In this constitution, even in the case of the fine wiring pattern having deep grooves and line width of 30 $\mu$m or less, a more favorable transfer is possible.

A conductive paste in an embodiment of the invention is a conductive paste used in the aforesaid manufacturing method of wiring board, and this conductive paste has plural resin components which are burnt and removed in a temperature of range from a temperature range of 150° C. to a temperature range of 360° C. at the time of firing. That is, the resin removing temperature range is 150° C. to 360° C. The resin removing temperature range means a temperature difference between a beginning temperature and a ending temperature, in which the beginning temperature is a temperature that the resin beginning to be removed, and the ending temperature is a temperature that all of the resin finish to be removed. In this constitution, since the plural resin components in the paste are removed in a wide temperature range in a long time (that is, since the temperature range is wide from 180 to 360° C. of the component removed first and component removed last out of the resin components in the paste), the resin component can be removed slowly in a long time, and therefore the sintering timing of conductive particles can be delayed. As a result, a pattern of high precision can be formed without being influenced by softening of the adhesive layer.

A conductive paste in other embodiment of the invention is a conductive paste used in the aforesaid manufacturing method of wiring board, and this conductive paste has plural resin components which are burnt and removed in a temperature range of 200 to 500° C. at the time of baking. In this constitution, the conductive particles can be sintered same as or later than the timing of softening and burning of the adhesive layer. As a result, a pattern can be formed without being influenced by softening or removing of the adhesive layer.

A conductive paste in a different embodiment of the invention is a conductive paste used in the aforesaid manufacturing method of wiring board, and this conductive paste has plural resin components which have such a property that the exothermic curve forms a broad profile when these plural resin components are burnt and removed. In this constitution, the heat generation of the paste is uniform. Moreover, since abnormal heating of adhesive layer is prevented, sudden deformation of adhesive layer due to effects at the time of paste burning can be avoided.

Preferably, the conductive paste has the conductive component which contains at least one selected from the group consisting of copper, silver, silver-palladium, gold, and silver-platinum. In this constitution, a wiring electrode of a low resistance necessary for ceramic wiring board can be formed.

Preferably, the particle size of conductive particles is 0.8 to 4.0 $\mu$m. In this constitution, the conductive paste can be easily applied to fill up the intaglio pattern for fine lines of high density. Further, a conductive paste with less pattern deformation is obtained.

Preferably, the conductive paste has a sticking material (or fasting material) which contains at least one metal component selected from the group consisting of zinc, copper, and bismuth. In this constitution, the adhesion of the conductive pattern and substrate after firing may be improved.

Preferably, the conductive paste has a viscosity in a range of 200,000 to 700,000 cps in the measuring condition of 25° C. and 10 rpm. In this constitution, the intaglio pattern of the wiring pattern having a line width of 30 $\mu$m or less can be filled with conductive paste.

Preferably, terpineol is used as the solvent. In this constitution, it is possible to dry easily after the intaglio is filled. As a result, if the intaglio grooves are filled with much paste, the grooves can be filled with the conductive paste without forming bubbles.

Exemplary embodiments of the invention are described below.

Exemplary Embodiment 1

A forming method of an end electrode of a wiring board of an exemplary embodiment of the invention is described below while referring to the drawings.

FIG. 1 shows a process chart of a manufacturing method of wiring board in the embodiment. In FIG. 1, (a) is a step of filling an intaglio of polyimide film with a conductive paste, (b) is a step of forming an adhesive layer on a ceramic substrate, (c) is a step of adhering the intaglio of polyimide film to the ceramic substrate having the adhesive layer, (d) is a step of peeling the intaglio from the ceramic substrate, and (e) is a step of firing (or baking) the ceramic substrate.

The manufacturing method of wiring board is described in detail below. An intaglio 1 is made of a polyimide film, and this intaglio 1 has plural layers of grooves. The grooves of the intaglio 1 are filled with a conductive paste 3 by using a ceramic squeegee 2. The conductive paste 3 is then dried for 10 minutes at temperature of 100° C. Since the conductive paste 3 is contracted by drying, after drying, the filling step and drying step are repeated plural times. Thus, the entire grooves of the intaglio are filled completely with the conductive paste 3. The conductive paste 3 comprises conductive particles as a conductive component, a metal component as a sticking material, a resin as a binder, and a solvent for adjusting the viscosity. The resin also plays the role of adjusting the exothermic temperature of the heat generated when burning the resin. The conductive paste 3 should preferably contain a material excellent in peeling performance from the grooves after drying, and a material including a temperature range necessary for softening and burning of an adhesive layer 5 mentioned later. In this embodiment, such material is realized by combining plural resins which are removed at 220 to 450° C. As conductive particles, gold with particle size of 3.0 μm are used. The adhesive is bismuth. The viscosity of this conductive paste is 700,000 cps (centipoise) in the measuring condition of 25° C. and 10 rpm (revolutions per minute).

Consequently, the adhesive layer 5 is formed on a ceramic substrate 4. The adhesive layer 5 is required to have a property of hardly adhering to the intaglio and a property of easily adhering to the substrate. Butyral resin is used as the material having such properties. By firing, the butyral resin begins to soften at 370 to 380° C., and burns at 400 to 420° C. Then the intaglio 1 is pressed to the ceramic substrate 4 at 50 kg/cm² for 10 minutes at temperature of 150° C. Thus, the conductive paste 3 is bonded to the ceramic substrate 4, and the intaglio 1 is peeled off the conductive paste 3. Thus, the conductive pattern of the conductive paste 3 is transferred on the ceramic substrate 4. Then, the ceramic substrate 4 forming the conductive pattern is fired (or baking) in the in-out condition for 1 hour of peak temperature of 850° C. and 10 minutes. Thus, the conductive pattern of the conductive paste 3 is fired. The ceramic substrate 4 has through-holes 6.

The process of firing the conductive pattern of the conductive paste 3 is explained below. First, when firing begins, softening of the butyral resin of the adhesive layer 5 starts, and part of the butyral resin is burnt along with the temperature rise. At the same time, part of the plural resin components contained in the conductive paste 3 is burnt. Herein, the resin components contained in the conductive paste 3 function to suppress sintering of conductive particles. Thus, sintering of conductive particles starts by burning and removing of resin components.

When the firing temperature reaches 370 to 380° C. softening of the butyral resin of the adhesive layer 5 is nearly terminated, and the majority of the butyral resin is burnt. On the other hand, several kinds of the resin components contained in the conductive paste 3 remain unburnt at this stage, and hence sintering of conductive particles is not advanced so much.

As the firing temperature further climbs up to 400 to 420° C., burning of butyral resin of the adhesive layer 5 is nearly terminated, and the adhesive layer 5 is removed. On the other hand, the remaining portion of the resin components contained in the conductive paste 3 is fully advanced in burning in this stage, and the sinter of conductive particles is formed on the ceramic substrate directly without the intermediate adhesive layer 5. Thus, the conductive paste 3 formed the conductive pattern, which is securely adhered and formed on the ceramic substrate 4.

Thus, according to the embodiment, the conductive paste in the intaglio having plural layers of groves can be completely transferred onto the ceramic substrate. Even in the constitution having the fine pattern of which line width of wiring pattern is 30 μm or less, the wiring pattern can be formed in a thick film. By using this conductive paste, moreover, at the time of firing, the conductive particles of the conductive paste can be sintered during combustion or after combustion after softening of the adhesive layer, so that the conductive particles can be sintered regardless of softening or removing of the adhesive layer. As a result, without deforming the conductive pattern, a wiring pattern of high precision can be formed.

Exemplary Embodiment 2

A conductive paste in an embodiment of the invention is described below.

In this embodiment, the manufacturing method of wiring board using the conductive paste is same as in the preceding embodiment. Therefore the explanation of the manufacturing method of wiring board is omitted.

The conductive paste used in the embodiment contains silver of particle size of 2.3 μm as conductive particles, zinc as sticking material, plural resins, and a solvent. Various pastes A, B, C, D, E, F, G as shown in Table 1 were prepared. These pastes have different components. The viscosity of the conductive paste is adjusted to 580,000 cps in the measuring condition of 25° C. and 10 rpm. The resin removing temperature range of the pastes is summarized in Table 1. The resin removing temperature range means a temperature difference between a beginning temperature and a ending temperature, in which the beginning temperature is a temperature that the resin beginning to be removed, and the ending temperature is a temperature that all of the resin finish to be removed.

TABLE 1

| Type of paste | Resin removing temperature range. (° C.) |
| --- | --- |
| A | 50 |
| B | 100 |
| C | 150 |
| D | 230 |
| E | 300 |
| F | 360 |
| G | 400 |

The pastes in Table 1 were compared. When using pastes A and B, sintering of the conductive paste was advanced, but the conductive pattern after firing was deformed. When using paste G, sintering state was poor, and conductive pattern of high wiring density could not be obtained. When using pastes C, D, E, and F, excellent conductive patterns having dense electrode state were obtained without causing deformation after firing. In particular, when using the paste D having the removing temperature range of 200 to 250° C., the conductive pattern of the best electrode surface state was obtained.

It is hence understood that it is ideal to use the conductive paste of which plural resin components may be burnt and removed in a temperature having range from a temperature range of 150 to a temperature range of 360° C. at the time of firing. When using such paste, the plural resin components in the paste are removed in a wide temperature range in a long time, and the sintering timing of conductive particles can be delayed, and a conductive pattern of high precision without deformation can be formed without having effects of softening of the adhesive layer. By using the conductive paste having such temperature characteristic prepared by combining plural resins, the exothermic curve when these resin components are removed forms a broad profile, and the heat generation value of the conductive paste is uniform, and abnormal heating of the adhesive layer is prevented, and sudden deformation of the adhesive layer is avoided.

Exemplary Embodiment 3

A conductive paste in an embodiment of the invention is described below.

In this embodiment, the manufacturing method of wiring board using the conductive paste is same as in embodiment 1. Therefore the explanation of the manufacturing method of wiring board is omitted.

The conductive paste used in the embodiment contains plural resin components, which are burnt and removed with temperature range of 200° C. at the time of firing. The conductive paste also contains silver-palladium of particle size of 1.0 µm as conductive particles, copper as sticking material, a solvent, and resins. Various pastes H, I, J, K, L, M, N as shown in Table 2 were prepared. These pastes have different components. The viscosity of the conductive paste is adjusted to 320,000 cps in the measuring condition of 10 rpm and 25° C. The temperature which the resin in the paste is removed is summarized in Table 2.

TABLE 2

| Type of paste | Resin removing temperature (° C.) |
|---|---|
| H | 100~300 |
| I | 150~350 |
| J | 200~400 |
| K | 240~440 |
| L | 300~500 |
| M | 350~550 |
| N | 400~600 |

The pastes in Table 2 were compared. When using pastes H and I, the conductive pattern after firing was deformed. When using pastes M and N, sintering state was poor, and electrode pattern of high density could not be obtained. When using pastes J, K, and L, excellent wiring patterns having dense electrode state were obtained without causing pattern deformation after firing. In particular, when using the paste K having the range of removing temperature of 240 to 440° C., the conductive pattern of the best electrode surface state was obtained.

It is hence understood that it is ideal to use the conductive paste of which plural resin components may be burnt and removed in range of a temperature between 200° C. and 500° C. at the time of baking. As the plural resin components contained in the conductive paste are burnt and removed in a temperature range 200 to 500° C. at the time of baking, since this range of temperature is same as the range of temperature necessary for softening and removing of the adhesive layer, conductive particles are sintered same as or later than the timing of softening and removing of the adhesive layer. As a result, an excellent conductive pattern can be formed without having effects of softening of the adhesive layer.

In the foregoing three exemplary embodiments, similar effects are obtained by selecting a conductive paste of which plural resin components are burnt and removed in a temperature having a range from a temperature range of 150° C. to a temperature range of 360° C. at the time of firing, or by selecting a conductive paste of which plural resin components are burnt and removed in a range of temperature of 200 to 500° C. at the time of baking.

In the embodiments, silver, silver-palladium, or gold is used as the conductive component, but not limited to them, a conductive paste containing at least one of copper, silver, silver-palladium, gold, and silver-platinum can be used, and same effects are obtained in such constitution.

In the embodiments, conductive particles with mean particle size of 3.0, 2.3, or 1.0 µm are used, but not limited to them, any conductive particles with mean particle size ranging from 0.8 to 4.0 µm can be used, and same effects are obtained in such constitution. If the particle size of conductive particles is less than 0.8 µm, the sintering timing is advanced, and pattern deformation may be caused. If the particle size of conductive particles is more than 4.0 µm, intaglio grooves of fine lines may not be sufficiently filled with the conductive paste.

In the embodiments, the viscosity of the conductive paste is 700,000, 580,000, or 320,000 cps, but not limited to them, a conductive paste having viscosity in a range of 200,000 to 700,000 cps (viscosity in rotating condition of 10 rpm and 25° C.) is preferably used, and same effects are obtained.

As the solvent of the conductive paste in the embodiments, terpineol is used. In particular, when terpineol is used as the solvent, drying after filling of intaglio is easy, and the intaglio can be filled densely.

In this embodiment, the firing means a baking.

As clear from the description herein, in the constitution of the invention, conductive particles can be sintered without being influenced by softening and removing of the adhesive layer. As a result, a wiring pattern of high precision can be formed without causing deformation of conductive pattern.

What is claimed is:

1. A manufacturing method of wiring board comprising the steps of:
   (a) forming an adhesive layer on a surface of a ceramic substrate,
   (b) forming a groove having a wiring pattern shape on a film,
   (c) filling said groove with a conductive paste, said paste comprising a conductive component and a binder resin, said binder resin being a mixture of a plurality of resins,
   (d) adhering a conductive paste side surface of said film to an adhesive layer side surface of said ceramic substrate and forming a first laminated body, said first laminated body comprising said film, said conductive paste, said adhesive layer, and said ceramic substrate,
   (e) forming a conductive pattern on said adhesive layer surface, by peeling off said film from said first laminated body, thereby transferring said conductive paste to said adhesive layer surface and forming a second laminated body, said second laminated body comprising said ceramic substrate, said adhesive layer, and said conductive pattern, and
   (f) firing said second laminated body, thereby burning said binder resin, is removing said adhesive layer, and sintering said conductive particles,
   wherein the binder resin has an overall temperature difference during burning from a beginning of said burning to an end of said burning of from 150 centigrade degrees to 350 centigrade degrees.

2. The manufacturing method of wiring board of claim 1, wherein at said step (t), said resins contained in said conductive paste is burnt and removed after said adhesive layer is burnt and removed.

3. The manufacturing method of wiring board of claim 1, wherein said groove has a step groove formed in plural steps, and said conductive pattern has a protrusion having plural steps according to said plural steps of said step groove.

4. The manufacturing method of wiring board of claim 1, wherein said step (c) of filling said groove with said conductive paste further includes a step of drying said conductive paste filling in said groove.

5. The manufacturing method of wiring board of claim 1, wherein said step (c) of filling said groove with said conductive paste further includes a step of drying said conductive paste filling said groove, and a step of repeating said filling step and drying step plural times.

6. The manufacturing method of wiring board of claim 1, wherein said step (d) includes a step of adhering said conductive paste side surface of said film having said conductive paste to the adhesive layer side surface of said ceramic substrate having said adhesive layer, while heating and compressing.

7. The manufacturing method of wiring board of claim 1, wherein said adhesive layer contains a thermoplastic resin as a principal component.

8. The manufacturing method of wiring board of claim 1, wherein said resins are burned over a range of from 200 centigrade degrees to 250 centigrade degrees.

9. The manufacturing method of wiring board of claim 1, wherein at said step (f), said resin contained in said conductive paste is burnt and removed in a temperature range which achieves burning of said adhesive layer.

10. The manufacturing method of wiring board of claim 1, wherein at step (f), said resins contained in said conductive paste are burnt and removed, and said resins have such a property that an exothermic curve showing the heating value generated at the time of firing of said resin forms a broad profile.

11. The manufacturing method of wiring board of claim 1, wherein said conductive component contained in said conductive paste contains at least one selected from the group consisting of copper, silver, silver-palladium, gold, and silver-platinum.

12. The manufacturing method of wiring board of claim 1, wherein said conductive component contained in said conductive paste has conductive particles of which mean particle size is 0.8 $\mu$m to 4.0 $\mu$m.

13. The manufacturing method of wiring board of claim 1, wherein said conductive paste contains a sticking material, and said sticking material contains at least one material selected from the group consisting of zinc, copper, and bismuth.

14. The manufacturing method of wiring board of claim 1, wherein said conductive paste has a viscosity in a range of 200,000 to 700,000 cps in the measuring condition of 25° C. and 10 rpm.

15. The manufacturing method of wiring board of claim 1, wherein said conductive paste contains a solvent, and said solvent has terpineol.

* * * * *

UNITED STATES PATENT AND TRADEMARK OFFICE
CERTIFICATE OF CORRECTION

PATENT NO. : 6,514,364 B2
DATED : February 4, 2003
INVENTOR(S) : Miura et al.

It is certified that error appears in the above-identified patent and that said Letters Patent is hereby corrected as shown below:

<u>Column 8,</u>
Line 47, delete "is".
Line 52, "350" should read -- 360 --.
Line 54, "(t)" should read -- (f) --.

Signed and Sealed this

Fourth Day of November, 2003

JAMES E. ROGAN
*Director of the United States Patent and Trademark Office*